United States Patent
Doyle (10) Patent No.: US 6,184,739 B1
(45) Date of Patent: Feb. 6, 2001

(54) ADVANCED NEAR IDEAL MIXER

(75) Inventor: James T. Doyle, Chandler, AZ (US)

(73) Assignee: Intel Corporation, Santa Clara, CA (US)

( * ) Notice: Under 35 U.S.C. 154(b), the term of this patent shall be extended for 0 days.

(21) Appl. No.: 09/205,992

(22) Filed: Dec. 4, 1998

(51) Int. Cl.$^7$ ..................................................... G06F 7/44
(52) U.S. Cl. .......................... 327/359; 327/357; 455/333
(58) Field of Search ........................... 327/116, 119–122, 327/356, 357, 359; 455/326, 333

(56) References Cited

U.S. PATENT DOCUMENTS

| | | | | |
|---|---|---|---|---|
| 4,058,771 | * | 11/1977 | Ohsawa et al. | 325/446 |
| 4,313,221 | * | 1/1982 | Mattfeld | 455/319 |
| 4,461,042 | * | 7/1984 | Tanabe et al. | 455/333 |

OTHER PUBLICATIONS

Ali M. Niknejad, Robert G. Meyer; "Analysis, Design and Optimization of Spiral Inductors and Trasnfomers for Si RF ICs"—1998 IEEE International Solid–State Circuits Conference.

H. M. Wang, Bell Labs, Lucent—"A IV Multi–Gigahertz RF Mixer Cove in 0;.5um CMOS"—1998 IEEE Solid–State Circuits Conferen7ce SP23.4.

J. Burghartz, D. Edelstein, M. Soyuer, H. Ainspan, K. Jenkins; "RF Circuit Design Aspects of Spiral Inductors on Silicon"—1988 IEEE International Solid–State Circuits Conference.

Jian–jun Zhou, David J. Allstot; "A Fully Integrated CMOS 900MHz LNA Utilizing Monolithic Transformers"—1998 IEEE International Solid–State Circuits Conference.

Paul R. Gray, Robert G. Meyer—"Analysis and Design of Analog Integrated Circuits", Third Edition; John Wiley & Sons, Inc.–13 1998 IEEE International Solid–State Circuits Conference.

Patrick Favre, Norbert Joehl, Michel Declercq, Catherine Dehollain, Phillipe Deval ":A2V, 600mA. 1GHz. BICMOS Super–Regenerated Receiver"—1998 IEEE International Solid State Circuits Conference.

S.Wu, B. Razavi, "A 900 MHz/1.8BGHz CMOS Receiver for Dual Band Applications"; 1998 IEEE International Solid–State Circuits Conference.

* cited by examiner

Primary Examiner—Kenneth B. Wells
(74) Attorney, Agent, or Firm—Blakely, Sokoloff, Taylor & Zafman LLP (57) ABSTRACT

A method and apparatus pertains to a mixer. A first differential pair has a first and a second drain lead coupled to a first and a second gate lead respectively. A first transformer is coupled to the first and the second drain lead. A second differential pair has a third and a fourth gate lead coupled to the second and the first gate lead of the first differential pair respectively. A third differential pair has a fifth and a sixth gate lead coupled to the first and the second gate lead of the first differential pair if the mixer is performing as a down converter, and has fifth and sixth drain leads coupled to third and fourth drain leads of the second differential pair respectively. A second transformer is coupled to a first and a second base lead of the second and the third differential pair respectively.

33 Claims, 8 Drawing Sheets

ADVANCED NEAR IDEAL MIXER

BACKGROUND

1. Field of the Invention

The present invention relates generally to mixers and in particular to a mixer that exhibits very good linearity at low voltages.

2. Description of the Related Art

A mixer is a circuit that receives separate input signals and combines the signals to produce an output signal. Such circuit is an important building block in communications, for example, wireless radio frequency devices. Mixers may be also widely used in infrared networks and fiber optic communication systems. Generally, mixers, may be used where frequency up or down conversion may be required in a modulation scheme. Frequency conversion is the changing of one frequency to another. This may occur in instances when one signal is multiplied with a second signal to produce, a sum and/or difference of the signals. By using this feature, in one example, the mixer allows very high frequency to be downconverted to baseband or intermediate frequency (IF) so that signals may be evaluated using analog or digital signal processing techniques. In another example, the mixer upconverts a low frequency to a very high frequency.

Figure 1:
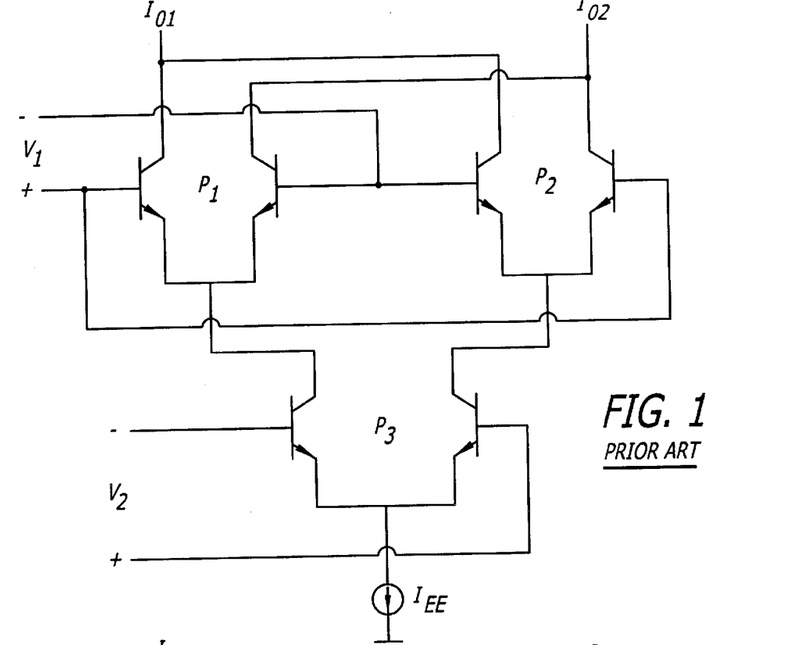
FIG. 1 illustrates a Gilbert cell mixer configuration using bi-polar transistors.

One well-known mixer configuration is the Gilbert cell which is illustrated in FIG. 1. The configuration of the Gilbert cell may be two differential bipolar transistor pairs P1,P2 cascaded with an output of another differential bipolar transistor pair P3 to form a four-quadrant mixer. A four-quadrant mixer allows input signals to be combined for all polarities of signals. In comparison, a two-quadrant mixer allows input signals to be combined for the same polarity of signals. For practical purposes, a mixer should at least be a two-quadrant mixer. Using bipolar transistors in the Gilbert cell may be advantageous in that bipolar transistors are exponential law devices. Stated differently, a relationship between collector to base voltage $V_{CB}$ and the collector current $I_C$ is exponential. Although the relationship may not be purely linear in all regions, it is approximately linear in certain regions of the relationship. The equation below expresses the relationship between the differential output current and the two input voltages $V_1$ and $V_2$ of the Gilbert cell.

$$\Delta I = I_{o1} - I_{o2} = I_{EE}\left[\tanh\left(\frac{V_1}{2V_T}\right)\right]\left[\tanh\left(\frac{V_2}{2V_T}\right)\right]$$

$I_{EE}$ is the bias current and $V_T$ is the threshold voltage. Note that the hyperbolic tangent function is an infinite series representing multiple harmonics of the input signals and the output signals as expressed by the equation below.

$$\tanh x = x - \frac{x^3}{3} \ldots$$

Typically, a bandpass filter passes the desired output signal and filters out the remaining undesirable signals. While the Gilbert cell may be successfully implemented in circuits using bipolar transistors, such may not be the case where Gilbert cell configuration is used in a complementary metal oxide semiconductor (CMOS) circuit.

Figure 2:
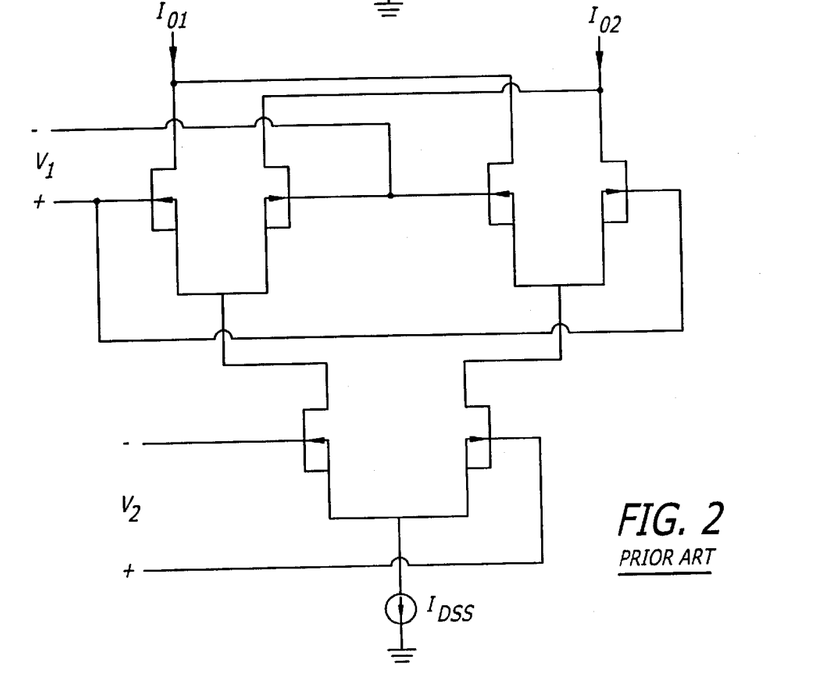
FIG. 2 illustrates a Gilbert cell mixer configuration using CMOS devices.

FIG. 2 illustrates a Gilbert cell configuration using CMOS devices. One disadvantage of CMOS is that it is a square law device. Stated differently, drain current $I_D$ is a square law function of gate to source voltage $V_{GS}$, therefore, non-linear distortion, inherently exist when the mixer is driven by input signals using gate to source or gate to drain relationships. The equation below expresses the output differential current in terms of input voltages $V_1$ and $V_2$.

$$\Delta I = I_{o1} - I_{o2} = I_{DSS}\left(1 - \frac{V_1}{V_P}\right)^2\left(1 - \frac{V_2}{V_P}\right)^2$$

$I_{DSS}$ is the bias current and $V_P$ is the pinch-off voltage. From the equation above, it may be readily understood that a square law device is inherently nonlinear.

Another disadvantage that exists regarding Gilbert cell using CMOS devices is that the Gilbert cell design is based on stacked differential pairs, (i.e. one differential pair is stacked on top of another differential pair). Stated differently, a supply voltage may need to be sufficient to sustain the collector to emitter voltages VCE of two stacked transistors and corresponding loads. A stacked differential pair is generally not a problem in bipolar transistor circuits where it is presumed to operate at high voltage supply, for example, 6–12 volts. However, CMOS circuits are generally designed to operate at lower voltages, typically, 3 volts or lower. With the advancement of integrated circuit technology, CMOS circuits may be expected to operate at 2 volts or lower. This complicates circuits using a stacking arrangement, for example, the Gilbert cell, since it generally requires voltage to be higher than 3 volts to drive stacked transistors. Therefore, a Gilbert cell using CMOS devices may not be compatible for usage in low voltage circuits, for example, portable communication devices such as cellular phones.

Another problem with the Gilbert cell design is that the bi-polar transistor being an exponential law device or, in the case of CMOS device, a square law device, the output produces multiple harmonics requiring unwanted signals to be filtered out using a filter. This requires additional circuits and results in consumption of valuable power which is a problem in portable communication devices. In response, the present invention is directed to a mixer that does not use stacked differential pairs like the Gilbert cell. Instead, the mixer uses parallel differential pairs that may allow the mixer to operate at supply voltages of 1.2 volts or lower, for example. Further, the mixer overcomes the non-linear distortion inherent in CMOS devices.

SUMMARY OF THE INVENTION

A method and apparatus for implementing a mixer. A first transformer is provided for receiving a first signal. A second transformer is provided for receiving a second signal. A device is provided for multiplying the first and the second signal, the device coupled to the first transformer for receiving the first signal and further coupled to the second transformer for receiving the second signal.

BRIEF DESCRIPTION OF THE DRAWINGS

The objects, features and advantages of the method and apparatus for the present invention will be apparent from the following description in which.

DETAILED DESCRIPTION OF THE INVENTION

A low distortion, low voltage mixer that utilizes parallel differential pairs as opposed to stacked differential pairs is described. An input signal is introduced to the mixer through the drain leads of one differential pair and another input signal is introduced at the base leads of two other differential pairs thereby bypassing the conventional gate to source or gate to drain input signal introduction. Transformers may be used to introduce the input signals to the mixer. Throughout the description, a differential pair will be referred to. A differential pair is a pair of transistors, for example, X1 and X2 (see FIG. 3) where the source leads of the two transistors are connected together to form a base lead. In this configuration, the differential pair has two drain leads, two gate leads and a base lead.

Figure 3:
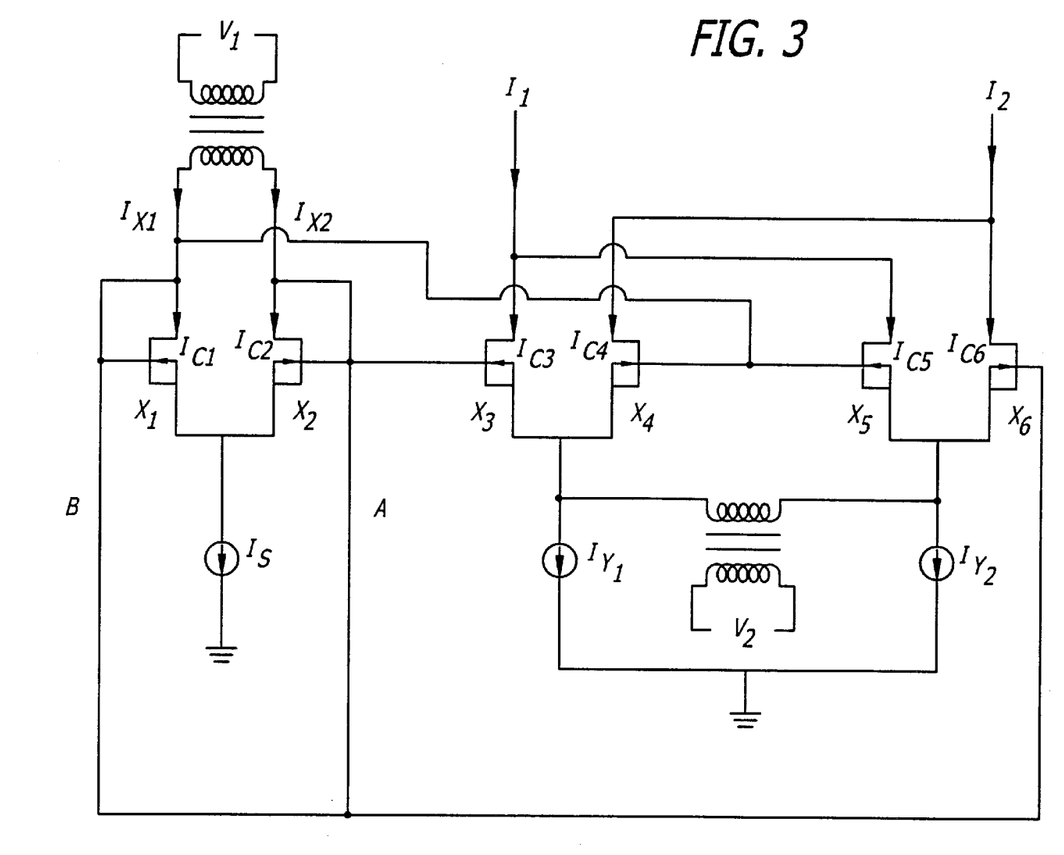
FIG. 3 illustrates an exemplary mixer configuration of the present invention.

FIG. 3 illustrates one embodiment of the present invention. Instead of introducing an input signal to the gate of a CMOS device, transformers may be used to introduce one signal through the drain leads of a differential pair, and another signal may be introduced at the base leads of two other differential pairs connected in parallel. Note that although CMOS devices are illustrated, other transistors such as bi-polar transistors may be used. According to one example, a specification such as the one below may be obtained from the mixer described above:

| | | |
|---|---|---|
| Voltage Requirement | = | 1.2 Volts |
| Power Requirement | = | 15 milliwatts |
| Conversion Gain | = | 15 db |
| LO referred SPDR | = | −20 to −6 dbm (input level) |
| IIP3 input referred | = | 0 dbm |
| IIP3 output referred | = | 15 dbm |
| Noise FIG. ref. 50MHz IF | = | 25 db |
| Mixing Products (Able-Baker) | = | N/A - non-existent |

From the specification above, one skilled in the art will recognize that the features are desirable for low power portable communication devices. The mixer relies on a common gate configuration and transimpedence between sources and drains. As a result, the gates of the transistors at the inputs of the mixer are bypassed resulting in minimal square law distortion being produced by the mixer. Additionally, by using a parallel differential pair couplings configuration, the mixer may be able to operate at low voltages. A DC analysis of the mixer will now be done as proof of principle. In doing the analysis, the output resistance of a CMOS device and that of the biasing current source is neglected. The gate of the CMOS device is assumed to be infinite resistance, thus no gate current flows through the gate.

Assuming MOSFETS X1 and X2 to have infinite resistance at the gates, no current flows in or out of the gates, thus $$I_S = I_{x1} + I_{x2} \qquad 1.)$$

where $I_S$ is the bias current for the first differential pair and $I_{x1}$ and $I_{x2}$ are the differential input current.

MOSFET X1 and MOSFETs X4 and X5 are configured to be current mirrors. MOSFETs X2 and MOSFETS X3 and X6 are also configured to be current mirrors. Current mirror is based on the principle that if the gate-source potential of two identical MOSFETs are equal, the channel currents should be equal. From FIG. 3, it is readily comprehensible that the gate-source potential of the MOSFETs X1, X2, X3, X4, X5 and X6, are equal. Furthermore, MOSFETs X1 and X2 are differential pair; MOSFETs X3 and X4 are differential pair; and MOSFETs X5 and X6 are also differential pair. Therefore:

$$\frac{I_{C1}}{I_{C2}} = \frac{I_{C3}}{I_{C4}} = \frac{I_{x1}}{I_{x2}} = \frac{I_{c6}}{I_{C5}} \qquad 2.)$$

Turning to the 2nd differential pair, similarly MOSFETS X3 and X4 are assumed to have infinite resistance at the gates, thus $$I_{y1} = I_{c3} + I_{c4} \qquad 3.)$$

Substituting equation 2 into equation 3:

$$I_{y1} = I_{c4} \frac{I_{x1}}{I_{x2}} + I_{c4} \qquad 4.)$$

$$I_{y1} = I_{c4}\left(\frac{I_{x1}}{I_{x2}} + 1\right)$$

$$I_{c4} = \frac{I_{y1} I_{x2}}{I_{x1} + I_{x2}}$$

Turning to the 3rd differential pair, similarly MOSFETs X5 and X6 are assumed to have infinite resistance at the gates, thus $$I_{y2} = I_{c5} + I_{c6} \qquad 5.)$$

substituting equation 2 into equation 5

$$I_{y2} = I_{c6} \frac{I_{x2}}{I_{x1}} + I_{c6} \qquad 6.)$$

$$I_{y2} = I_{c6}\left(\frac{I_{x2}}{I_{x1}} + 1\right)$$

$$I_{c6} = \frac{I_{y2} I_{x1}}{I_{x1} + I_{x2}}$$

Turning to the differential output of the mixer:

$$I_1 = I_{c3} + I_{c5}$$

$$I_2 = I_{c4} + I_{c6}$$

thus $$I_1 - I_2 = I_{c3} + I_{c5} - I_{c4} - I_{c6} \qquad 7.)$$

substituting equations 3 and 5 into equation 7

$$I_1-I_2=(I_{y1}-I_{c4})+(I_{y2}-I_{c6})-I_{c4}-I_{c6}$$

$$I_1-I_2=(I_{y1}+I_{y2})-2(I_{c4}+I_{c6}) \qquad 8.)$$

substituting equations 4 and 6 into equation 8

$$I_1 - I_2 = (I_{y1} + I_{y2}) - 2\left(\frac{I_{y2}I_{x1}}{I_{x1}+I_{x2}} + \frac{I_{y2}I_{x1}}{I_{x1}+I_{x2}}\right) \qquad 9.)$$

$$I_1 - I_2 \frac{I_{y1}(I_{x1}+I_{x2}) + I_{y2}(I_{x1}+I_{x2}) - 2I_{y1}I_{x2} - 2I_{y2}I_{x1}}{I_{x1}+I_{x2}}$$

$$I_1 - I_2 \frac{I_{y1}I_{x1} + I_{y2}I_{x2} - I_{y1}I_{x2} - I_{y2}I_{x1}}{I_{x1}+I_{x2}}$$

$$I_1 - I_2 \frac{(I_{y1}-I_{y2})(I_{x1}-I_{x2})}{I_{x1}+I_{x2}}$$

substituting equation 1 into equation 8

$$I_1 - I_2 \frac{(I_{y1}-I_{y2})(I_{x1}-I_{x2})}{I_s} \qquad 10.)$$

From above, it is readily comprehensible that a linear multiplication is produced with no infinite series expansion typically found in the Gilbert cell mixers using bipolar transistors or CMOS devices. Referring back to FIG. 3, when the mixer is to be uses as a signal down converter, connection B is used. When the mixer is to be used as a signal up converter, connection A is used. A selector may be designed that automatically switches from one connection to another dependent on the input signal to operate as a down converter or an up converter. Note that connection A produces both the sum and the difference of the two signal sources. Using an appropriate filter, the sum or the difference of the two signal sources may be passed at the output.

Figure 4:
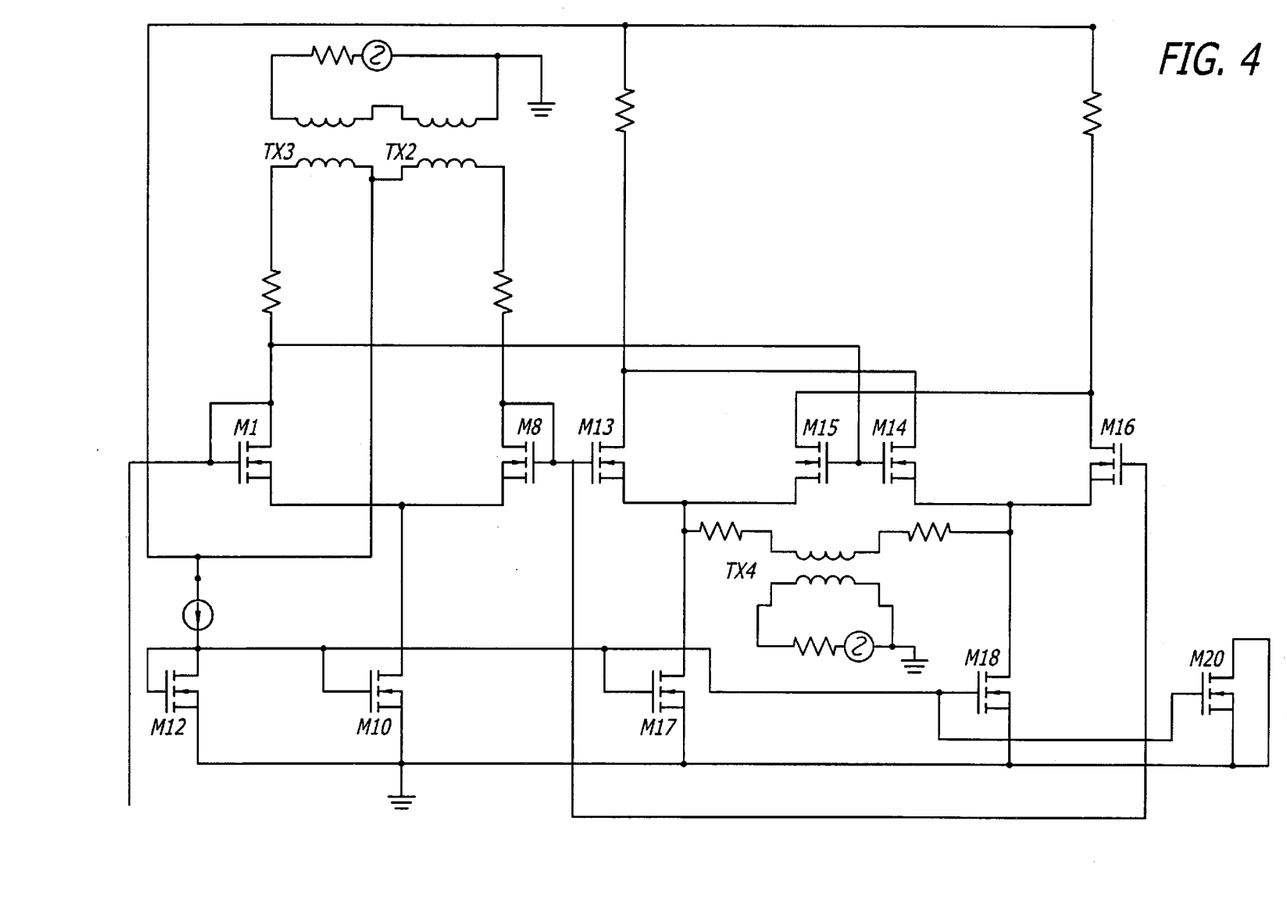
FIG. 4 illustrates a more detailed exemplary mixer configuration of the present invention.

FIG. 4 is a more detailed embodiment of the present invention. In this embodiment, the mixer operates as a down converter (i.e. converting a very high frequency to an intermediate frequency, for example). In this embodiment, MOSFETs M1 and M8 form a first differential pair; MOSFETs M13 and M15 form a second differential pair; and MOSFETs M14 and M16 form a third differential pair. As to the remaining MOSFETs, they form current sources for the respective differential pairs. A first input signal may be supplied to the mixer through the drain of the first differential pair using transformers TX2 and TX3. The transformers may be external transformers or on-chip transformers to be further described. A second input signal may be supplied to the mixer through the source of the second and third differential pairs using transformer TX4. To minimize frequency harmonics and to increase power handling capabilities of the mixer, it is desirable that the inputs of the differential pairs be balanced.

In one technique, balancing is performed by matching the impedance of the inputs of the differential pairs with the impedance of the input signal sources. For example, if the input signals have impedance of 50 ohms, it is desirable to match the input of the differential pairs to have 50 ohms. In one embodiment, the field effect of the channel in the MOSFETs may be used to match the impedance of the input signal sources. The field effect of the channel may be controlled by a plurality of electrodes or "fingers" at the gate. The impedance matching may be provided by adjusting the number of fingers in the gate that provides the field effect in the channel of the MOSFETs. Below is a table listing the specifications of the various MOSFETs to provide a matched input impedance in one example of the mixer as illustrated in FIG. 4. In the table, L is the length of the finger, W is the width of the finger, M is the number of fingers, Ibias is the bias current of the transistor and GM is the transconductance of the transistor.

| Transistor | L | W | M | $I_{Bias}$ | GM |
|---|---|---|---|---|---|
| M_M1 | .6U | 10U | 100 | 1.37E − 03 | 2.75E − 02 |
| M_M14 | .6U | 10U | 100 | 1.36E − 03 | 2.72E − 02 |
| M_M8 | .6U | 10U | 100 | 1.37E − 03 | 2.75E − 02 |
| M_M15 | .6U | 10U | 100 | 1.36E − 03 | 2.72E − 02 |
| M_M13 | .6U | 10U | 100 | 1.36E − 03 | 2.72E − 02 |
| M_M16 | .6U | 10U | 100 | 1.36E − 03 | 2.72E − 02 |
| M_M10 | .6U | 10U | 50 | 2.74E − 03 | 2.62E − 02 |
| M_M12 | .6U | 10U | 50 | 3.00E − 03 | 2.74E − 02 |
| M_M17 | .6U | 10U | 50 | 2.72E − 03 | 2.61E − 02 |
| M_M18 | .6U | 10U | 50 | 2.72E − 03 | 2.61E − 02 |
| M_M20 | .6U | 10U | 50 | 0.00E + 00 | 0.00E + 00 |

Input signals may be introduced through transformers coupled to the mixer. The transformers may be external or implemented in a semiconductor die (known as on-chip planar transformers). External transformers are easier to design with high-Q factors than on-chip planar transformers because there are less physical constraints. A transformer with a high-Q factor is desirable, since this translates to improvement in the signal to noise (S/N) ratio. Furthermore, high-Q factor also translates to low resistive loss in the spiral coil. Ideally, transformers being reactive devices should not produce a physical load on the coupled circuit. Low resistive loss in a transformer is desirable when used to introduce input signals in the mixer because there would be minimal voltage drop across the transformer allowing the signal to pass through the transformer with minimal loss in power and distortion. Furthermore, transformers are effective isolating devices, isolating one circuit to another when transferring signals.

On-chip planar transformers are desirable in that miniaturization is possible. Further, because :he transformers are embedded in the silicon chip, they are typically protected from the external environment by a package enclosing the chip. External environment is generally corrosive thereby altering the characteristics of the transformers and reducing their reliability. The structural constraints may be defined by the number of turns (n), the wire width (W), the space (S), and the total area covered. In high frequency environments such as wireless communication devices, for example, one problem associated with on-chip planar transformers is that due to heavily doped silicon substrate, building a transformer on the substrate with a high Q-factor is rather difficult. This is due to losses suffered by eddy-current. In one embodiment, multi-metal layer inductor may be used to take advantage of oxide layers within the substrate to produce increased magnetic coupling while reducing total area covered in a substrate.

Figure 5A:
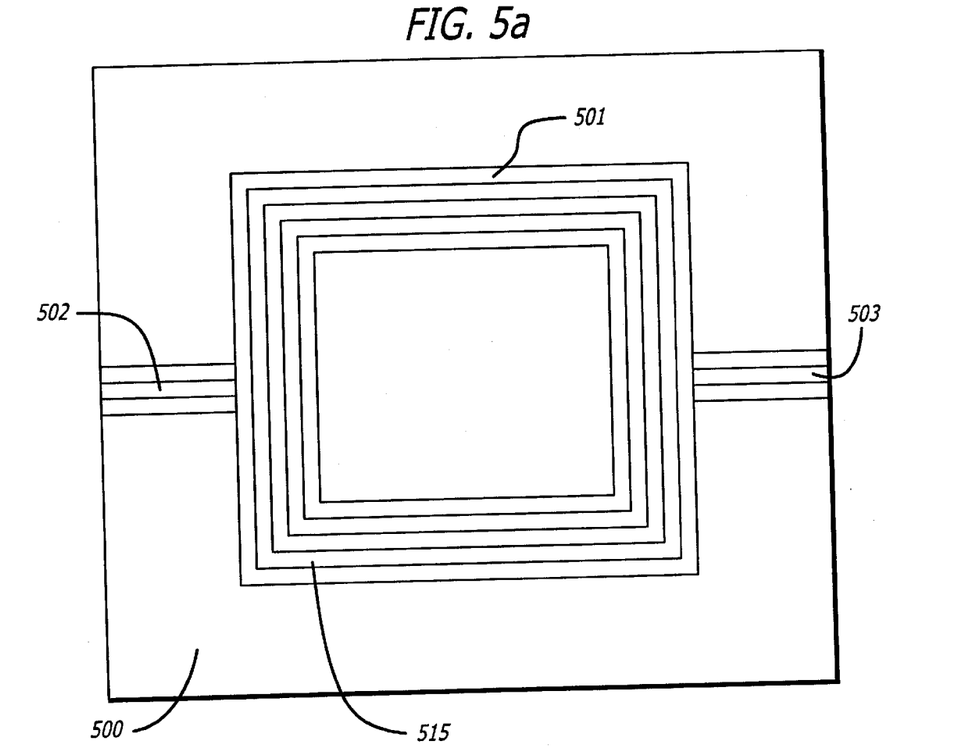
FIG. 5a illustrates an exemplary on-chip multi-layer transformer.
Figure 5B:
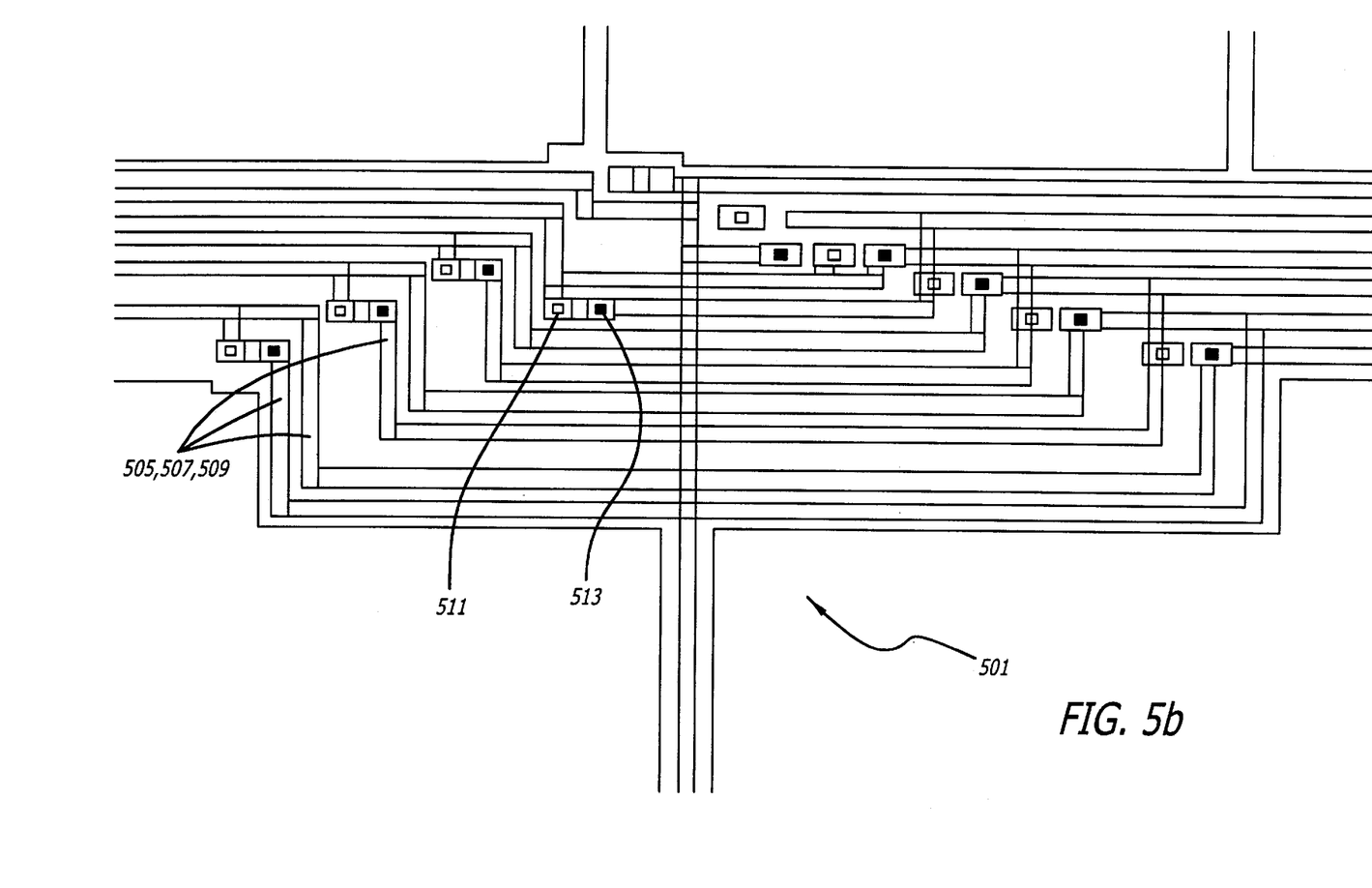
FIGS. 5b and 5c illustrate two inputs to the on-chip multi-layer transformer.
Figure 5C:
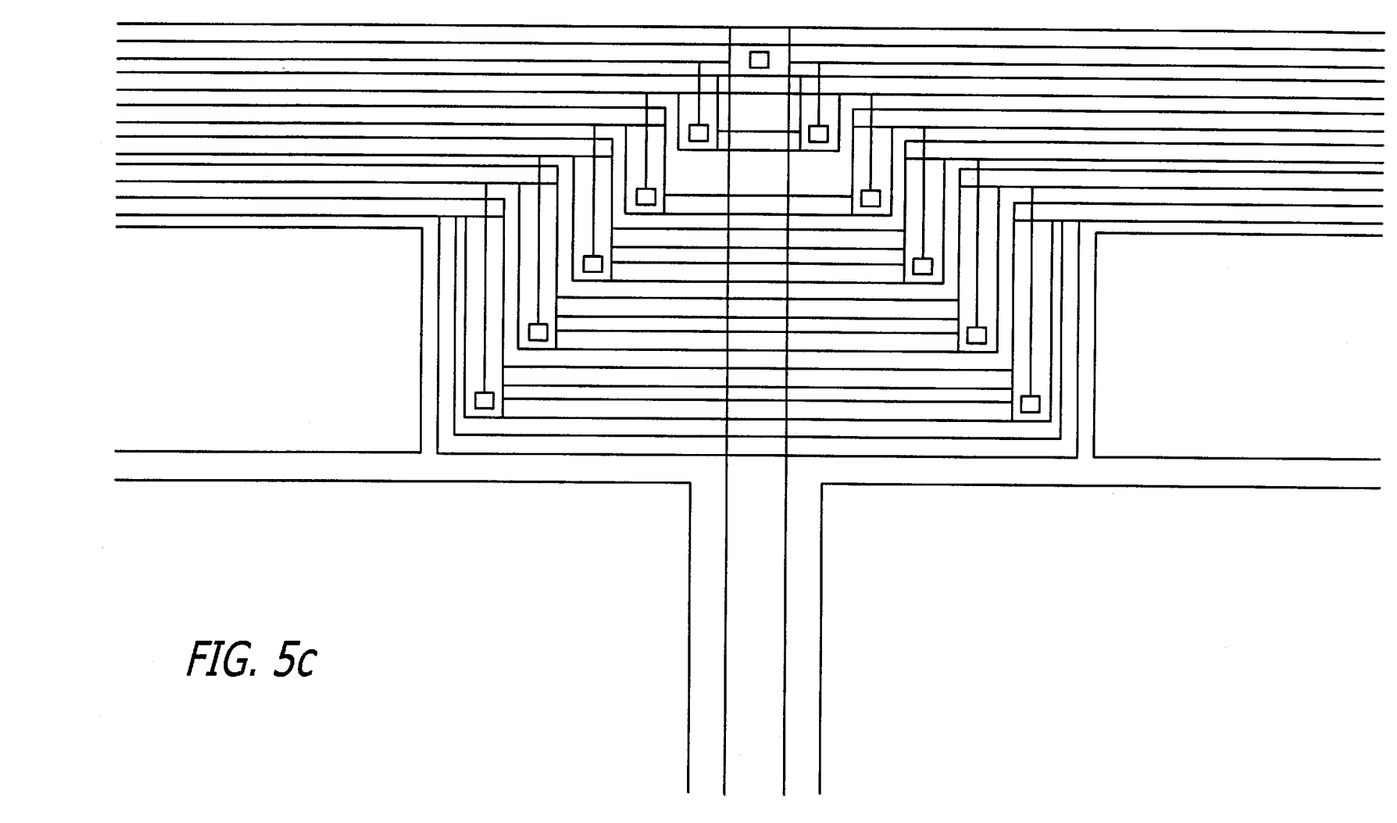

FIG. 5a illustrates a top view of one embodiment of an on-chip multilayer transformer 500. The transformer has two inputs 501, 502 and two outputs 503. FIG. 5b illustrates input 501 in greater detail and FIG. 5c illustrates input 502 in greater detail. Referring to FIG. 5b, in one example, three metal layers having metal lines 1, 2, and 3 illustrated by 505, 507 and 509 that are associated with the transformer. Connections between the various metal lines are made through vias 511, 513. The metal lines 505, 507, 509 may be 0.64 microns wide. The metal lines 505, 507, 509 are stacked on top of another, in the form of a square, around a center metal area 515 (see FIG. 5a) made from metal layers 1, 2 and 3 and may be 100×100 microns. Each turn has 3 layers of metal. There may be a 29 micron wide guard ring of metals 1, 2, and 3 around the transformer. There may be 0.64 micron squares of polymaterial such as polysilicon forming a grid (shown in FIGS. 6 and 7) under the metal layers, the center metal area and the metal guard ring. The purpose of the polymaterial grid is to form an uneven surface area under the elements identified above thereby breaking up eddy current paths. This allows the transformer to be built with high Q-factor. Regarding the turns of the wires, in the first turn, which is closest to the center, input1 is on metal 1 and metal 3 and input2 is on metal 2. In the second turn, input1 is on metal 2 and input2 is on metal 1 and metal 3. In the third turn, input1 is on metal 1 and metal 3 and input2 is on metal 2. In the fourth turn, input1 is on metal 2 and input2 is on metal 1 and metal 3. In the fifth turn, input1 is on metal 1 and metal 3 and input2 is on metal 2. In the last ½ turn, the inputs go out.

Figure 6:
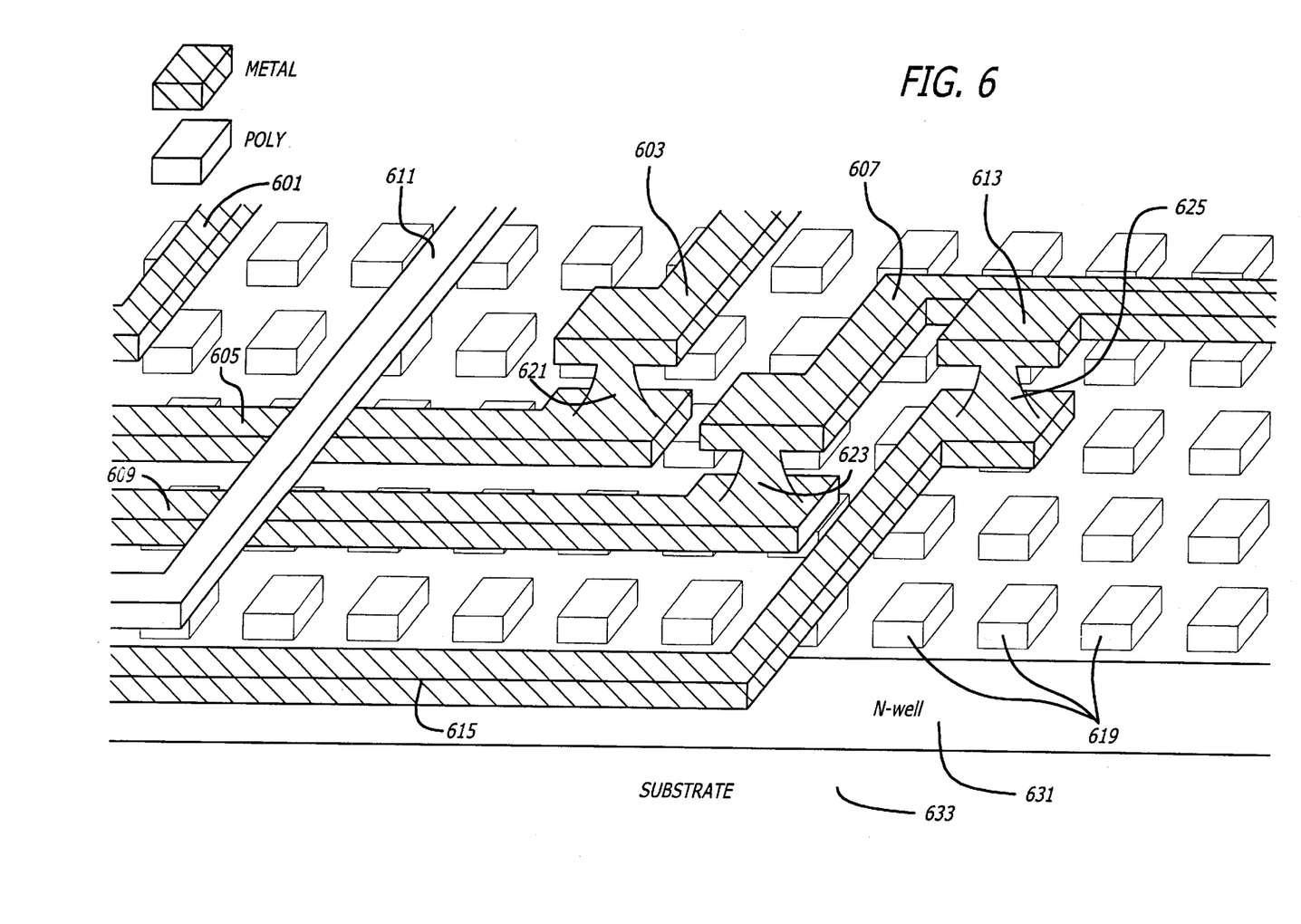
FIGS. 6 and 7 illustrate a cross sectional view of the exemplary on-chip multi-layer transformer.
Figure 7:
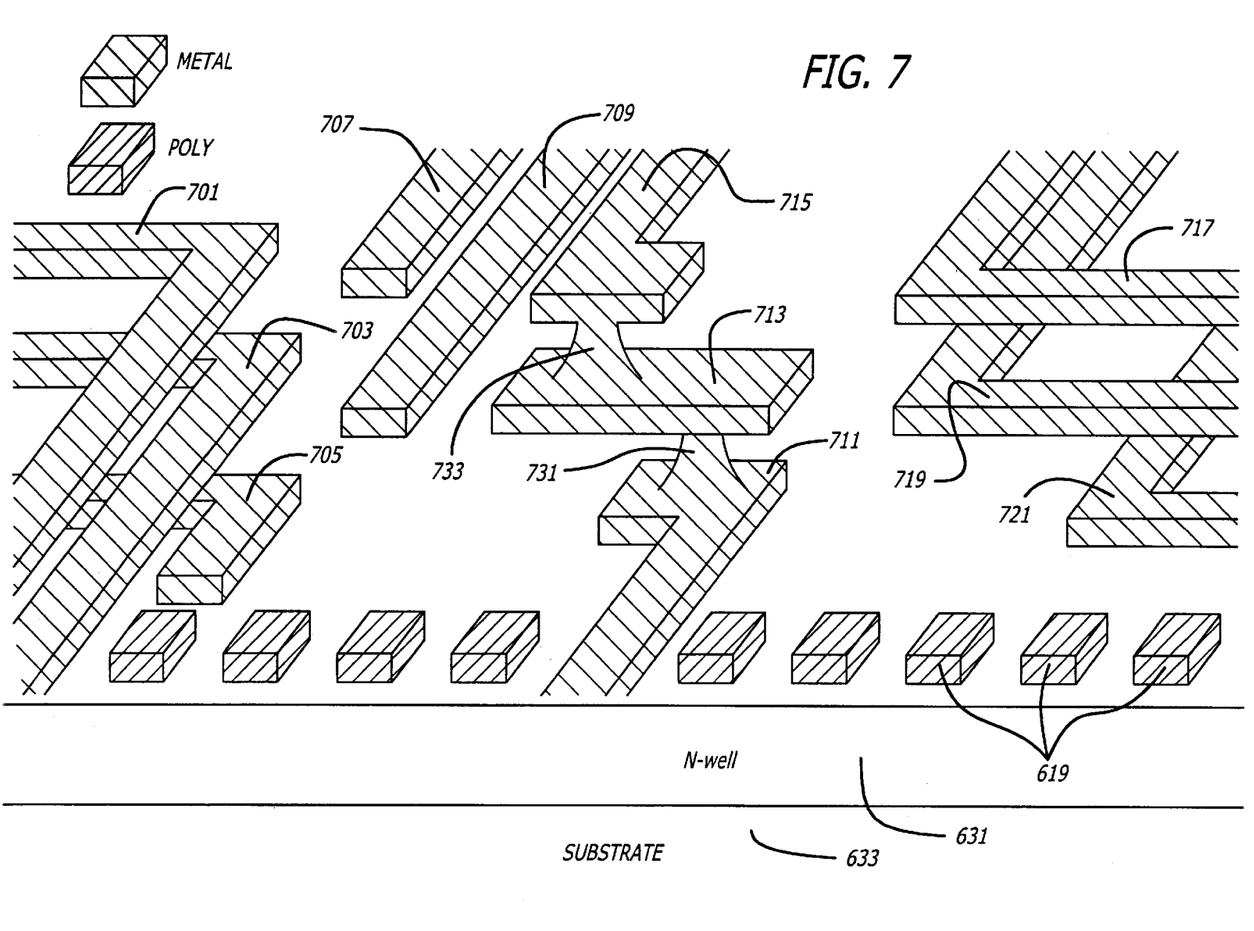

FIGS. 6 and 7 represent a cross sectional view of the transformer illustrated in FIG. 5. The vias (shown here as 621, 623, 625 and 731, 733) described above are seen more clearly in the cross sections. Beneath the metal wires 1, 2, and 3 are grids of polymaterial 619 that provide the uneven surfaces to the metal wires. Beneath the grids of polymaterial 619 is a N-well layer 631 and beneath the N-well layer 631 is a substrate 633. The N-well layer 631 and the substrate 633 are made of well known semiconductor materials. Between each of the metal layers is a dielectric material (not shown) separating the metal layers and is a well known composition.

Turning to FIG. 6, metal wire 601 represents metal wire 3 at turn 3. Metal wires 603 and 605 represent metal wire 3 at turn 2 being connected through a via 621 to metal wire 2 at turn 3 respectively. Metal wires 607 and 609 represent metal wire 2 at turn 2 being connected through a via 623 to metal wire 1 at turn 3 respectively. The metal wires 601, 605 and 609 are sticked on top of another. Metal wire 611 represent metal wire 3 at turn 2. Metal wires 613 and 615 represents metal wire 3 at turn 1 being connected through a via 625 to metal wire 2 at turn 2 respectively. Note that metal wires 611 and 615 are on top of each other. Turning to FIG. 7, metal wires 701, 703 and 705 represent metal wire 3 at turn 2, metal wire 2 at turn 2 and metal wire 1 at turn 2 respectively. These metal wires are on top of each other. Metal wires 707 and 709 are metal wire 3 at turn 4 and metal wire 2 at turn 4 respectively on top of another. Metal wires 711, 713 and 715 are metal wire 1 at turn 3 being connected to metal wire 2 through a via 731 which in turn is connected to metal 3 at turn 3 again through a via 733 respectively. Metal wires 717, 719 and 721 represent metal wire 3 at turn 2, metal wire 2 at turn 2 and metal wire 1 at turn 2 respectively. These metal wires are on top of each other.

Figure 8:
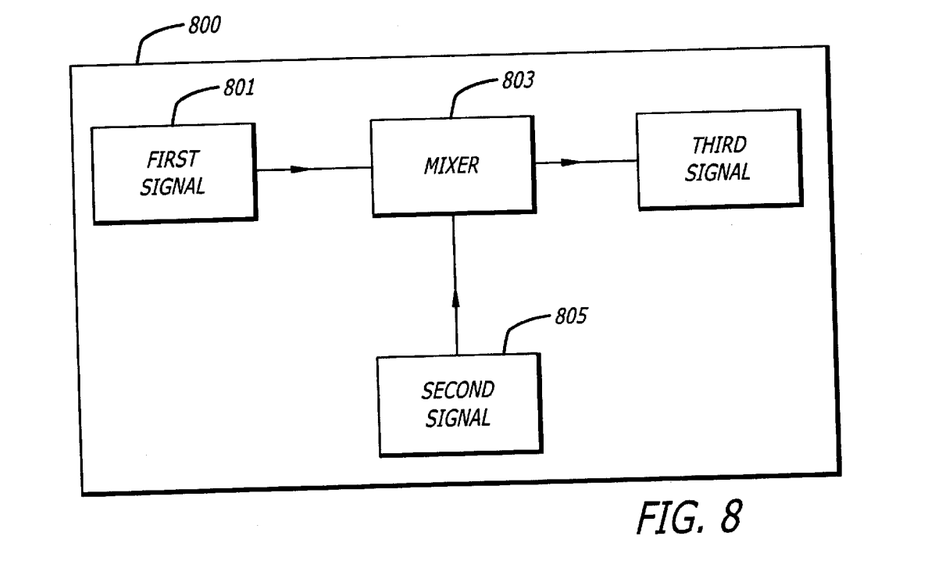
FIG. 8 illustrates a communication system using an exemplary mixer of the present invention.

FIG. 8 represents a communication system 800 that utilizes the mixer described above. A first signal source 801 transmits a first signal to an input of the mixer 803. A second signal source 805 transmits a second signal to another input of the mixer 803. The mixer 803 mixes the two signals to generate a third signal. The first signal may be a low frequency, an intermediate frequency, a very high frequency and ultra high frequency dependent on the mode the mixer is being used in (i.e. down converter or up converter). In one embodiment, the first signal source 801 may be transmitting a radio frequency. The second signal source 805 may be a local oscillator. The mixer 803 mixes the two signals to generate an intermediate frequency suitable for analog or digital signal processing to extract information in the radio frequency. In another embodiment, the first signal source 801 may be an intermediate frequency. The second signal source 805 may be a local oscillator. The mixer mixes the two signals to generate a radio frequency suitable for radio transmission, for example. One skilled in the art will recognize that any communication systems that use mixers may take advantage of the mixer described above.

In the foregoing specification, the invention has been described with reference to specific embodiments thereof. It will, however, be evident that various modifications and changes can be made thereto without departing from the broader spirit and scope of the invention as set forth in the appended claims. The specification and drawings are accordingly, to be regarded in an illustrative rather than a restrictive sense. Therefore, the scope of the invention should be limited only by the appended claims.

What is claimed is:

1. An apparatus comprising:
   a first transformer for receiving a first signal;
   a second transformer for receiving a second signal;
   a multiplier circuit coupled to said first transformer for receiving said first signal and further coupled to said second transformer for receiving said second signal, wherein
   said multiplier circuit comprises:
   a first differential pair having a first drain lead, a second drain lead, a first gate lead, and a second gate lead, wherein said first and said second drain leads are coupled to said first and said second gate leads respectively;
   a second differential pair having a third drain lead, a fourth drain lead, a third gate lead, a fourth gate lead and a first base lead, wherein said third and said fourth gate leads are coupled to said second and said first gate leads of said first differential pair respectively; and
   a third differential pair having a fifth drain lead, a sixth drain lead, a fifth gate lead, a sixth gate lead and a second base lead, wherein said fifth and said sixth gate leads are coupled to said first and said second gate leads of said first differential pair respectively wherein said apparatus is in a down converter mode, said fifth and said sixth gate leads are coupled to said first gate lead wherein said apparatus is in an up converter mode, said fifth and said sixth drain leads are coupled to said third and said fourth drain leads of said second differential pair respectively.

2. The apparatus of claim 1 wherein said first transformer has a first output and a second output, and said first and said second outputs are coupled to said first and said second drain leads of said first differential pair respectively.

3. The apparatus of claim 1 wherein said second transformer has a third output and a fourth output, and said third and said fourth outputs coupled to said first and said second base leads of said second and said third differential pair respectively.

4. An apparatus comprising:
   a first differential pair having a first drain lead, a second drain lead, a first gate lead, and a second gate lead, wherein said first and said second drain leads are coupled to said first and said second gate leads respectively;
   a first transformer having a first output and a second output, said first and said second outputs are coupled to said first and said second drain leads respectively;
   a second differential pair having a third drain lead, a fourth drain lead, a third gate lead, a fourth gate lead and a first base lead, wherein said third and said fourth gate leads are coupled to said second and said first gate leads respectively;

a third differential pair having a fifth drain lead, a sixth drain lead, a fifth gate lead, a sixth gate lead and a second base lead, wherein said fifth and said sixth gate leads are coupled to said first and said second gate leads respectively if said apparatus is in a down converter mode, said fifth and said sixth drain leads are coupled to said third and said fourth drain leads respectively;

a second transformer having a third output and a fourth output, said third and said fourth outputs coupled to said first and said second base leads respectively.

5. The apparatus according to claim 4 wherein said fifth and said sixth gate leads of said third differential pair are both coupled to said first gate lead of said first differential pair when said apparatus is in an up converter mode.

6. The apparatus according to claim 5, wherein said first differential pair, said second differential pair, and said third differential pair are a MOSFET pair having a source of each MOSFET coupled together to form a base lead.

7. The apparatus according to claim 5, wherein said first transformer further includes a first input and a second input adapted to receive a first signal source.

8. The apparatus according to claim 7, wherein said first signal source is one of a low frequency source, an intermediate frequency source, a very high frequency source, and an ultra high frequency source.

9. The apparatus according to claim 4, wherein said second transformer further includes a third input and a fourth input adapted to receive a second signal source.

10. The apparatus according to claim 9, wherein said second signal source is a local oscillator.

11. The apparatus according to claim 6, wherein each said MOSFET is impedance balanced.

12. The apparatus according to claim 11, wherein each MOSFET has a channel, each MOSFET is impedance balanced by adjusting a number of electrodes controlling a field in said channel, and each electrode has a predetermined length and width.

13. The apparatus according to claim 5, wherein each of said first transformer and said second transformer is a multi-metal-layer on-chip transformer.

14. The apparatus according to claim 5, wherein each of said first and second transformer comprises:

a center metal area;

a plurality of metal lines around said center metal area; and a grid of polymaterial under said center metal area and said plurality of metal lines to form an uneven surface area.

15. A method comprising:

coupling a first and a second drain lead to a first and a second gate lead in a first differential pair respectively;

coupling a first transformer to said first and said second drain leads;

coupling a third and a fourth gate lead in a second differential pair to said second and said first gate leads respectively;

coupling a fifth and a sixth gate lead of a third differential pair to said fourth and said third gate leads respectively;

coupling said fifth and said sixth gate leads to said first and said second gate leads of said first differential pair respectively when a mixer is in a down converter mode;

coupling said fifth and sixth gate leads to said first gate lead of said first differential pair when said mixer is in an up converter mode;

coupling a fifth and a sixth drain lead of a third differential pair to a third and a fourth drain lead of said second differential pair; and coupling a second transformer to a first base lead of said second differential pair and a second base lead of said third differential pair.

16. The method according to claim 15, further including the steps of:

coupling said first transformer to a first signal source;

coupling said second transformer to a second signal source; and generating a third signal at said third and said sixth drain leads.

17. The method according to claim 16, wherein said first signal source is one of a low frequency source, an intermediate frequency source, a very high frequency source and an ultra high frequency source.

18. The method according to claim 16, wherein said second signal source is a local oscillator.

19. The method according to claim 15, wherein each differential pair comprising MOSFETs, each MOSFET has a channel, each MOSFET is impedance balanced by adjusting a number of electrodes controlling a field in said channel, and each electrode has a predetermined length and width.

20. The method according to claim 15, wherein said first transformer is a multi-metal-layer on-chip transformer.

21. The method according to claim 15, wherein said second transformer is a multi-metal-layer on-chip transformer.

22. A communication system comprising:

a signal source;

a local oscillator;

a mixer, said mixer comprising:

a first differential pair having a first drain lead, a second drain lead, a first gate lead, and a second gate lead, wherein said first and said second drain leads are coupled to said first and said second gate leads respectively;

a first transformer having a first input, a second input, a first output and a second output, said first and said second input coupled to receive said signal source, said first and said second outputs are coupled to said first and said second drain leads respectively;

a second differential pair having a third drain lead, a fourth drain lead, a third gate lead, a fourth gate lead and a first base lead, wherein said third and said fourth gate leads are coupled to said second and said first gate leads respectively;

a third differential pair having a fifth drain lead, a sixth drain lead, a fifth gate lead, a sixth gate lead and a second base lead, wherein said fifth and said sixth gate leads are coupled to said first and said second gate leads respectively when said mixer is in a down converter mode, said fifth and said sixth gate leads are coupled to said first gate lead when said mixer is in an up converter mode, said fifth and said sixth drain leads are coupled to said third and said fourth drain leads respectively; and a second transformer having a third input, a fourth input, a third output and a fourth output, said third and said fourth input coupled to receive said local oscillator, said third and said fourth outputs coupled to said first and said second base leads respectively.

23. The system according to claim 22, wherein said first differential pair, said second differential pair, and said third differential pair is a MOSFET pair having a source of each MOSFET coupled together to form a base lead.

24. The system according to claim 22, wherein said signal source is one of a low frequency source, an intermediate frequency source, a very high frequency source and an ultra high frequency source.

25. The apparatus according to claim 23, wherein each said MOSFET is impedance balanced.

26. The system according to claim 25, wherein each MOSFET has a channel, each MOSFET is impedance balanced by adjusting a number of electrodes controlling a field in said channel, and each electrode has a predetermined length and width.

27. The apparatus according to claim 22, wherein said first transformer is a multi-metal-layer on-chip transformer.

28. The apparatus according to claim 22, wherein said second transformer is a multi-metal on-chip transformer.

29. An apparatus comprising:
    a first transformer for receiving a first signal;
    a second transformer for receiving a second signal;
    a multiplier circuit coupled to said first transformer for receiving said first signal and further coupled to said second transformer for receiving said second signal, wherein said multiplier circuit comprises:
    a first differential pair coupled to said first transformer, wherein said first differential pair further comprises: a first drain lead, a second drain lead, a first gate lead, and a second gate lead, wherein said first and said second drain leads are coupled to said first and said second gate leads, respectively; and
    a second differential pair coupled to said first differential pair a third differential pair and said second transformer, wherein said second differential pair and said third differential pair are coupled in parallel.

30. The apparatus of claim 29, wherein said second differential pair further comprises:
    a third drain lead, a fourth drain lead, a third gate lead, a fourth gate lead and a first base lead, wherein said third and said fourth gate leads are coupled to said second and said first gate leads of said first differential pair, respectively.

31. The apparatus of claim 30, wherein said third differential pair further comprises:
    a fifth drain lead, a sixth drain lead, a fifth gate lead, a sixth gate lead and a second base lead, wherein said fifth and said sixth gate leads are coupled to said first and said second gate leads of said first differential pair, respectively, and when said apparatus is in a down converter mode, said fifth and said sixth gate leads are coupled to said first gate lead wherein said apparatus is in an up converter mode, said fifth and said sixth drain leads are coupled to said third and said fourth drain leads of said second differential pair, respectively.

32. The apparatus of claim 29, wherein said first transformer has a first output and a second output, and said first and said second outputs are coupled to said first and said second drain leads of said first differential pair, respectively.

33. An apparatus comprising:
    a first transformer for receiving a first signal;
    a second transformer for receiving a second signal;
    a multiplier circuit coupled to said first transformer for receiving said first signal and further coupled to said second transformer for receiving said second signal, said first transformer has a first output and a second output, and said first and said second outputs are coupled to said first and said second drain leads of said first differential pair, respectively, wherein said multiplier circuit comprises:
    a first differential pair coupled to said first transformer;
    a second differential pair coupled to said first differential pair a third differential pair and said second transformer, wherein said second differential pair and said third differential pair are coupled in parallel.

* * * * *

UNITED STATES PATENT AND TRADEMARK OFFICE
CERTIFICATE OF CORRECTION

PATENT NO. : 6,184,739 B1
DATED : February 6, 2001
INVENTOR(S) : James T. Doyle

Page 1 of 1

It is certified that error appears in the above-identified patent and that said Letters Patent is hereby corrected as shown below:

<u>Column 7,</u>
Line 38, delete "sticked" and insert -- stacked --.
Line 39, delete "represent" and insert -- represents --.
Line 40, delete "represents" and insert -- represent --.

Signed and Sealed this

Twenty-eighth Day of May, 2002

*Attest:*

JAMES E. ROGAN
*Attesting Officer*   *Director of the United States Patent and Trademark Office*